United States Patent [19]

Hyde et al.

[11] Patent Number: 5,686,759

[45] Date of Patent: *Nov. 11, 1997

[54] INTEGRATED CIRCUIT PACKAGE WITH PERMANENT IDENTIFICATION OF DEVICE CHARACTERISTICS AND METHOD FOR ADDING THE SAME

[75] Inventors: John W. Hyde; Abby M. Schwartz, both of Portland, Oreg.

[73] Assignee: Intel Corporation, Santa Clara, Calif.

[*] Notice: The term of this patent shall not extend beyond the expiration date of Pat. No. 5,670,825.

[21] Appl. No.: 536,353

[22] Filed: Sep. 29, 1995

[51] Int. Cl.⁶ .............................. H01L 23/12; H01L 23/58
[52] U.S. Cl. .................. 257/730; 257/48; 257/273; 361/820; 324/765
[58] Field of Search ................ 257/48, 778, 797, 257/665, 730, 773; 361/820; 324/765

[56] References Cited

U.S. PATENT DOCUMENTS

| | | | |
|---|---|---|---|
| 5,107,523 | 4/1992 | Heaney et al. | 377/2 |
| 5,274,337 | 12/1993 | Young et al. | 328/138 |
| 5,334,857 | 8/1994 | Mennitt et al. | 257/48 |
| 5,351,001 | 9/1994 | Kornrumpf et al. | 324/158.1 |
| 5,410,163 | 4/1995 | Murakami | 257/48 |

FOREIGN PATENT DOCUMENTS

| | | | |
|---|---|---|---|
| 0291429 | 11/1988 | Japan | 257/665 |
| 0185744 | 8/1991 | Japan | 257/665 |
| 0369253 | 12/1992 | Japan | 257/48 |
| 0005667 | 1/1994 | Japan | 257/797 |

*Primary Examiner*—Tom Thomas
*Assistant Examiner*—David Ostrowski
*Attorney, Agent, or Firm*—Blakely, Sokoloff, Taylor & Zafman

[57] ABSTRACT

An integrated circuit (IC) device package that includes permanent identification regarding the device characteristics, wherein the permanent identification are at or below the surface of the package and may indicate the operating frequency of an IC die within the package, as well as voltage requirements, etc.

20 Claims, 3 Drawing Sheets

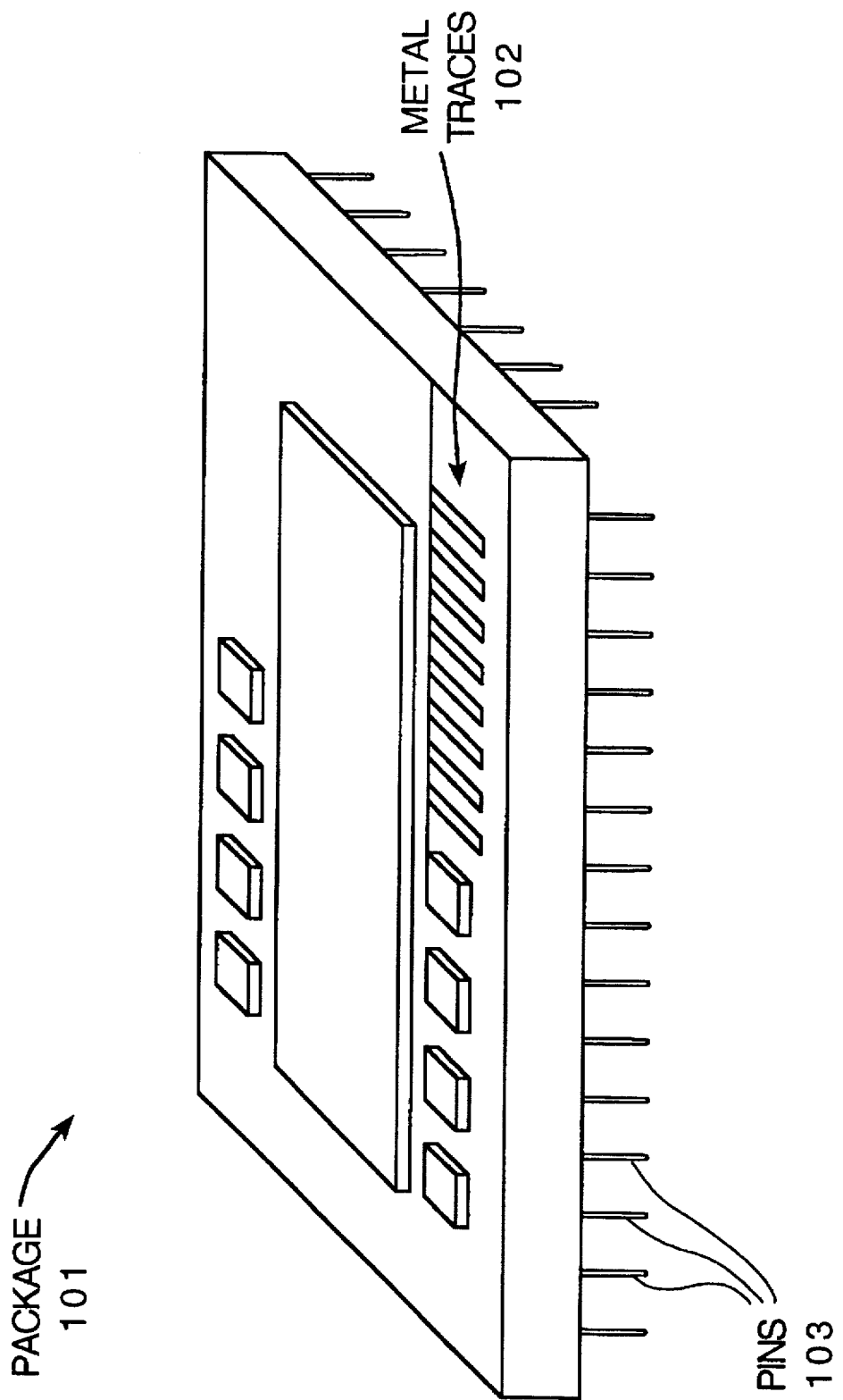

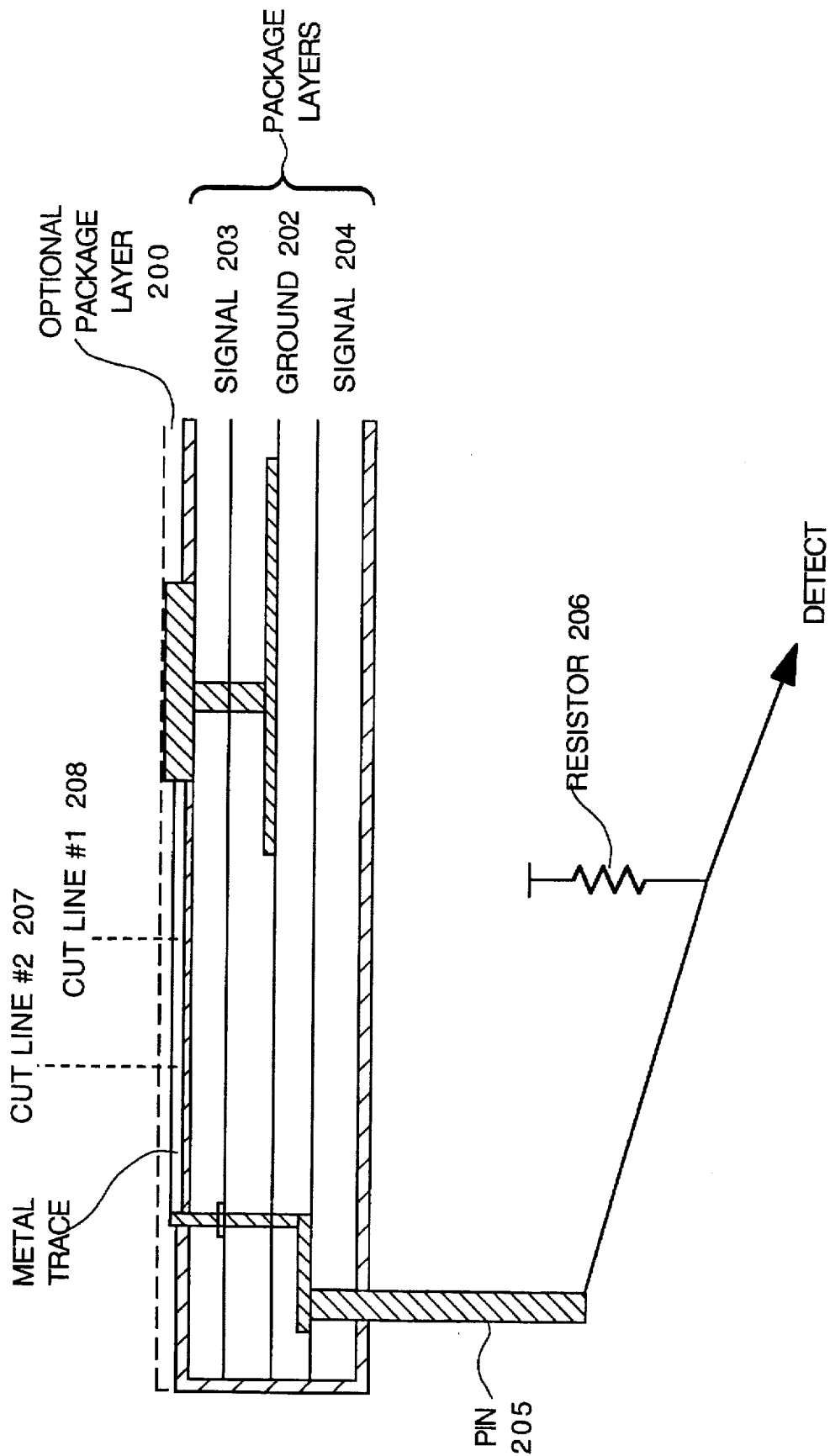
FIG_2

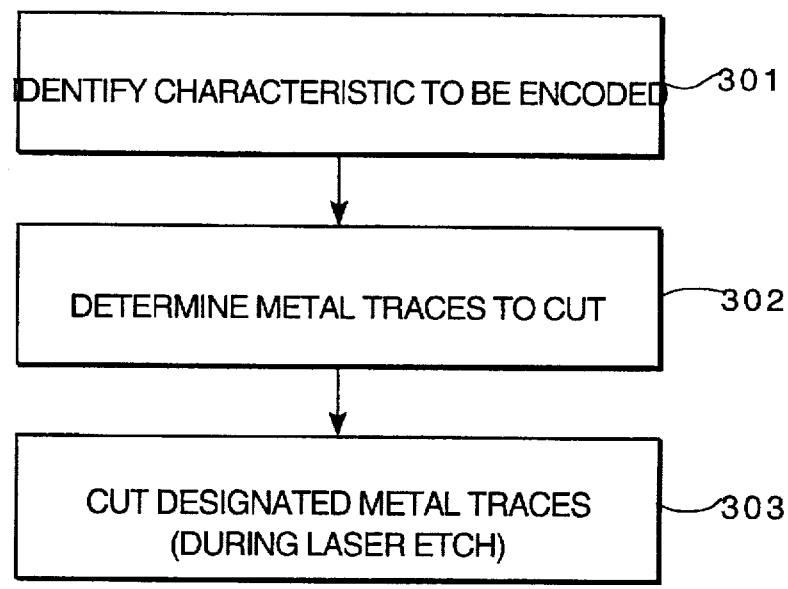
FIG_3
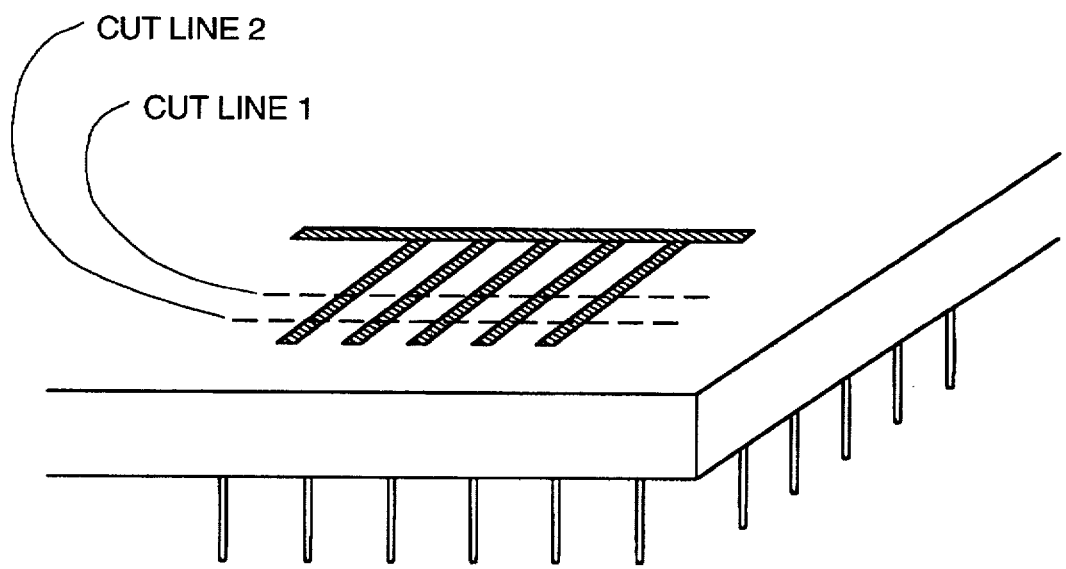
FIG_4

INTEGRATED CIRCUIT PACKAGE WITH PERMANENT IDENTIFICATION OF DEVICE CHARACTERISTICS AND METHOD FOR ADDING THE SAME

FIELD OF THE INVENTION

The present invention relates to the field of integrated circuit (IC) devices; more particularly, this invention relates to IC packages that have permanent identification of device characteristics contained therein.

BACKGROUND OF THE INVENTION

Processors and other integrated circuits in systems function according to an operating frequency. Many such systems include multiple devices. These devices do not always have the same operating frequency. For instance, some of today's computer systems include a processor that operates at one frequency while devices and the bus to which they are coupled operate at another frequency. In these systems, the bus typically operates at some fraction of the core speed of the processor. Thus, there is a bus/core speed ratio associated with the system. When devices have different operating frequencies, they must be interfaced to function currently.

With the advent of multiple processor bus/core speed ratios, it has been desirable to be able to query the processor for the maximum tested frequency in order to correctly set the bus ratio. If the ratio is set incorrectly, the processor could either be running faster than it is specified to operate or it may be operating at a non-optimal frequency. Unfortunately, the maximum core frequency is one of the last items to be tested in the manufacturing of integrated circuits and processors. In other words, it is a post-test characteristic. It would be desirable to be able to query the processor (or integrated circuit) for the maximum tested core frequency after the package has been sealed.

One possible solution to allow a processor to be queried and indicated its maximum tested core frequency which would be stored in an EPROM cell on these processor devices itself. However, this is not desirable because it increases die size and impacts the yield.

Another possible solution is to retest the microprocessor and then add the identifying markings. However, this additional step adds capital equipment and test time which increases the cost of the microprocessor.

In the fabrication of microprocessors, it is common to find that some of the microprocessors are able to operate at higher frequencies than others even though all are fabricated with the same process. Process variations effecting, for example, the thickness of oxides can cause some wafers runs to yield parts that operate at much higher frequencies than in other wafers runs. Some companies test the upper frequency performance of newly fabricated microprocessors and sort them into "frequency" bins. Consequently, some microprocessors when sold, are graded (and labeled) for higher frequencies than others. The microprocessor may not function properly at frequencies above its labeled frequency, especially under stressful ambient conditions or marginal power supply potentials.

The labeling of a microprocessor is done with a laser which cuts through the surface of the package to make a human-readable, permanent identification. This has proven more reliable than ink marking.

Companies have found that parts labeled with one frequency are sometimes relabeled after being sold by the manufacturer with high frequencies, and then resold. These relabeled parts could end up in computer systems sold to operate at higher frequencies than the manufacturer intended. An innocent purchaser of such a computer could find that the computer operates well part of the time but fails at other times. The failures may be difficult to trace and if traced to the microprocessor, reflect badly on the manufacturer.

The present invention provides identification information corresponding to characteristics of integrated circuits, such as, for example, their core frequency, in their package. The identification is added to the package after testing (i.e., post-test). Furthermore, the identification information is permanent and, thus, prevents remarking.

SUMMARY OF THE INVENTION

The present invention provides an integrated circuit (IC) device that has multiple pins and a package. The package encapsulates one or more IC dice that are coupled to the pins. The IC device also includes one or more indicators, such as, for instance, metal traces, that are coupled through the package to at least one pin. The indicator(s) identify a characteristic(s) of the IC dice within the package.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1 is a perspective view of an integrated circuit package of the present invention.

FIG. 2 illustrates a side section view of the package of the present invention and a detection point.

FIG. 3 is a process of fabricating the integrated circuit of the present invention.

FIG. 4 is a perspective view of the integrated circuit package of the present invention illustrating two cut lines directed through metal traces in the package.

DETAILED DESCRIPTION OF THE PRESENT INVENTION

An integrated circuit package is described. In the following description, numerous details are set forth, such as specific numbers of pins, numbers of traces, types of integrated circuit characteristics, etc., in order to provide a thorough understanding of the present invention. It will be apparent, however, to one skilled in the art, that the present invention may be practiced without these specific details. In other instances, well-known structures and devices are shown in block diagram form, rather than in detail, in order to avoid obscuring the present invention.

The present invention provides integrated circuit (IC) packages with permanent indications of device characteristics. In one embodiment, the permanent indications comprise metal traces on or near the surface of the package. Based on these traces, information corresponding to one or more characteristics of the integrated circuit(s) contained therein may be encoded into the package and used as a permanent reference for the information in the future. Using such an indication structure, various characteristics of the IC may be set forth, such as operating frequency, operating voltage, cache memory availability, cache memory size, etc. Note that many of these characteristics are post-test characteristics. These permanent identification are directly readable by the microprocessor during run-time operation.

FIG. 1 illustrates an integrated circuit package of the present invention. Referring to FIG. 1, the top of the package 101 shown with metal traces 102 near or on the surface and pins 103 at the bottom. Metal traces are standard elements of package construction and are well-known in the art. In one embodiment, metal traces 102 run parallel to a side of package 101.

The material comprising package 101 may be any one of the commonly used materials, such as, but not limited to, ceramic, plastic, etc. Metal traces 102 may comprise any conductive material (e.g., copper, gold, etc.). In one embodiment, metal traces 102 comprises 8 traces. However, any number of traces that can fit on the surface may be used (e.g., 1, 2, 3, 4, 16, 32, etc.). In one embodiment, each of the metal traces 102 is separated from neighboring traces by approximately the width of a single trace. Note that the distance between the metal traces is a design choice, as is the location of the metal traces on the surface of the package.

In one embodiment, metal traces 102 are below the external surface of package 101, as opposed to being on the surface. Metal traces 102 may be below the top layer of ceramic in a ceramic package.

FIG. 2 illustrates a section side view of package 101. Referring to FIG. 2, package 101 is shown having multiple package layers. Note that some of the package layers have been omitted to avoid obscuring the present invention. Ground planes, such as ground plane 202, are sandwiched between package layers, such as signal layers 203 and 204. An optional package layer 200 may be used to cover traces below the surface of the package 101.

One end of each of the metal traces attached in a manner well-known in the art at or near the surface of the package are coupled to the ground plane through the package. The other end of each of the traces is coupled through the package to a separate pin, such as pin 205, on the package that is used to detect the electrical state of the associated trace. Signals may also go from the metal traces to the microprocessor inside the package.

To detect the condition state of each trace, a weak current, such as 0–25 mA, is applied through a resistor 206 (e.g., 10KΩ) to the pin. If a metal trace is not cut, the electrical connection to ground is still in tact and the short on the package causes the detected signal to be low. If metal trace is cut, the application of the current results in the detect signal being set high. Different encodings of the metal traces is based on their conductivity and is accomplished by cutting one or more of the metal traces. The process of cutting is described in further detail below. Two separate cut lines, 207 and 208, are shown.

In one embodiment, each metal trace is coupled to a register in the IC device, as opposed to a pin. The register may then be read using software to obtain the necessary characteristic information.

One embodiment of the process of the present invention for adding the permanent identification to the package is shown in the flowchart of FIG. 3. Referring to FIG. 3, the process begins by identifying the characteristic to be encoded, post-test or otherwise (processing block 301). Then, a determination is made as to which of the metal traces are to be cut (processing block 302). Once determined, the designated metal traces are cut (processing block 303). In one embodiment, the designated metal traces are cut during a laser etch. The laser marking machine which is used to write the permanent human-readable package marking is also used to cut the metal traces. One or more cuts are made to each of the traces being cut. By including two cuts, no voltage gradient exists across the cut and the trace will not reconnect itself during use due to electromigration. FIG. 4 illustrates the two cut lines.

Optionally, any microscopic holes created during the cutting process may be filled, or plugged (processing block 304). In one embodiment, the material used to fill the hole comprises epoxy. Filling the holes prevents electromigration as well as prevents unscrupulous individuals from easily reconnecting traces.

Because these permanent identifications are readable by a computer, using the present invention as claimed, the BIOS of a computer system is able to configure a flexible motherboard at boot time to accept any of the CPU/cache arrangements which plug into the same socket. The characteristics of the plugged-in component would be read and that information would be used to configure the system.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of various embodiments are not intended to limit the scope of the claims which in themselves recite only those features regarded as essential to the invention.

We claim:

1. An integrated circuit device comprising:

a plurality of pins;

a package encapsulating at least one integrated circuit die and coupled to the plurality of pins;

at least one conductive indicator coupled through a portion of the package to individual pins of the plurality of pins to indicate a characteristic of said at least one integrated circuit by encoding the characteristic into the package based on a conductive state of each said at least one conductive indicator.

2. The device defined in claim 1 wherein the package includes a ground plane coupled to said at least one conductive indicator, wherein said at least one conductive indicator comprises a separated trace if the characteristic is a first operating feature of said at least one integrated circuit and is a non-separated trace if the characteristic is a second operating feature.

3. The device defined in claim 1 wherein said at least one conductive indicator comprises a separated trace if the characteristic is a first operating feature of said at least one integrated circuit and is a non-separated trace if the characteristic is a second operating feature.

4. The device defined in claim 1 wherein the characteristic comprises a post-test characteristic.

5. The device defined in claim 4 wherein the post-device characteristic comprises an operating frequency of the integrated circuit device.

6. The device defined in claim 4 wherein the post-test characteristic comprises an operating voltage of the integrated circuit device.

7. The device defined in claim 4 wherein the post-test characteristic comprises an indication as to additional memory within the package.

8. The device defined in claim 7 wherein the post-test characteristic indicates cache memory availability.

9. The device defined in claim 8 wherein the post-test characteristic indicates cache memory size.

10. The device defined in claim 1 wherein said at least one conductive indicator is coupled to an exterior portion of the package.

11. The device defined in claim 1 wherein said at least one conductive indicator is disposed within the package below an exterior surface of the package.

12. The device defined in claim 1 wherein said at least one conductive indicator comprises one or more metal traces.

13. The device defined in claim 12 wherein the plurality of traces are disposed under the surface of the package.

14. An integrated circuit device comprising:
   a package containing an integrated circuit die and having a ground plane disposed therein and a plurality of conductive traces, wherein a portion of each conductive trace is coupled to the ground plane; and
   a plurality of detection points coupled to the package, wherein individual conductive traces are coupled to individual detection points, wherein the plurality of traces indicate an individual characteristic of the integrated circuit by encoding the individual characteristic into the package based on a conductive state of each of the plurality of conductive traces.

15. The device defined in claim 14 wherein the plurality of conductive traces are attached to the exterior of the package.

16. A method of determining a characteristic of an integrated circuit device having a package, said method comprising the steps of:
   encoding the characteristic permanently into the package by cutting metal traces disposed within package material;
   querying the device for the characteristic including the step of reading the encoded characteristic from the metal traces within the package material.

17. The method defined in claim 16 wherein the step of querying the device includes applying a current to a pin on the device to determine its potential.

18. The method defined in claim 16 wherein the step of cutting the metal traces comprises laser marking the package to cut by the metal traces.

19. The method defined in claim 16 further comprises the step of reading the permanent identification to determine an operating frequency.

20. The method defined in claim 19 configuring a computer system based on the characteristic obtained from reading the permanent identification.

* * * * *